(12) United States Patent
He

(10) Patent No.: US 10,048,531 B2
(45) Date of Patent: Aug. 14, 2018

(54) MANUFACTURING METHOD FOR COLOR FILTER SUBSTRATE AND MANUFACTURING METHOD FOR LIQUID CRYSTAL PANEL

(71) Applicant: Shenzhen China Star Optoelectronics Technology Co., Ltd., Shenzhen, Guangdong (CN)

(72) Inventor: Hui He, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 258 days.

(21) Appl. No.: 15/110,095

(22) PCT Filed: May 27, 2016

(86) PCT No.: PCT/CN2016/083648
§ 371 (c)(1),
(2) Date: Jul. 6, 2016

(87) PCT Pub. No.: WO2017/185447
PCT Pub. Date: Nov. 2, 2017

(65) Prior Publication Data
US 2018/0107054 A1    Apr. 19, 2018

(30) Foreign Application Priority Data
Apr. 26, 2016  (CN) .......................... 2016 1 0270239

(51) Int. Cl.
*G02B 5/20* (2006.01)
*G02F 1/1335* (2006.01)
(Continued)

(52) U.S. Cl.
CPC ....... *G02F 1/133516* (2013.01); *G02B 5/201* (2013.01); *G02B 5/223* (2013.01);
(Continued)

(58) Field of Classification Search
CPC ............ G03F 7/0007; G02F 1/133512; G02F 1/133514; G02F 1/133516;
(Continued)

(56) References Cited

U.S. PATENT DOCUMENTS

2004/0096756 A1* 5/2004 Cheng ................. G02F 1/13394
430/7
2016/0349419 A1* 12/2016 Wu ........................ G02B 5/201

FOREIGN PATENT DOCUMENTS

CN    102681067 A    9/2012
CN    102707354 A    10/2012
(Continued)

OTHER PUBLICATIONS

Computer-generated translation of KR 20007-0078000 (Jul. 2007).*
(Continued)

*Primary Examiner* — John A McPherson
(74) *Attorney, Agent, or Firm* — Andrew C. Cheng

(57) ABSTRACT

A manufacturing method for color filter substrate is disclosed. The method includes: coating and exposing three layers of photoresist materials on a first substrate, and colors of the three layers of the photoresist materials are respectively a red color, a green color and a blue color; in the coating and exposure processes, a red color resist block, a green color resist block and a blue color resist block are formed; forming a light-shielding layer through mixing of two different colors of the photoresist materials in the three layers of the photoresist materials; and forming a spacing layer through stacking of two different colors of the photoresist materials in the three layers of the photoresist materials. A manufacturing method for liquid crystal panel is also disclosed. The present can simplify the manufacturing pro-
(Continued)

cess of the color filter substrate, reduce the process of the liquid crystal panel and decrease the manufacturing cost.

18 Claims, 7 Drawing Sheets

(51) Int. Cl.
 *G02F 1/1339* (2006.01)
 *G02F 1/1341* (2006.01)
 *G03F 7/00* (2006.01)
 *G02B 5/22* (2006.01)
 *G03F 7/30* (2006.01)
 *G03F 7/16* (2006.01)
 *G03F 7/20* (2006.01)

(52) U.S. Cl.
 CPC ........ *G02F 1/1341* (2013.01); *G02F 1/13394* (2013.01); *G02F 1/133512* (2013.01); *G03F 7/0007* (2013.01); *G02F 2001/13396* (2013.01); *G02F 2001/13398* (2013.01); *G02F 2001/13415* (2013.01); *G03F 7/16* (2013.01); *G03F 7/20* (2013.01); *G03F 7/30* (2013.01)

(58) Field of Classification Search
 CPC . G02F 2001/13396; G02F 2001/13398; G02F 1/13394; G02B 5/201; G02B 5/223
 USPC ...................................... 430/7; 349/106, 156
 See application file for complete search history.

(56) References Cited

FOREIGN PATENT DOCUMENTS

| CN | 104597656 | | 5/2015 |
| CN | 104932139 | A | 9/2015 |
| CN | 105353567 | | 2/2016 |
| KR | 2007-0078000 | A * | 7/2007 |
| KR | 20080082718 | A | 9/2008 |

OTHER PUBLICATIONS

Computer-generated translation of CN 102681067 (Sep. 2012).*
Computer-generated translation of CN 104932139 (Sep. 2015).*
Computer-generated translation of CN 102707354 (Oct. 2012).*

* cited by examiner

MANUFACTURING METHOD FOR COLOR FILTER SUBSTRATE AND MANUFACTURING METHOD FOR LIQUID CRYSTAL PANEL

CROSS REFERENCE

The claims of this application have submitted to the State Intellectual Property Office of the People's Republic of China (SIPO) on Apr. 26, 2016, Application No. 201610270239.X. The priority right based on the China application has a title of "Manufacturing method for color filter substrate and manufacturing method for liquid crystal panel". The entire contents of the above-mentioned patent application will be incorporated in the present application through citing.

FIELD OF THE INVENTION

The present invention relates to liquid crystal display technology field, and more particularly to a manufacturing method for color filter substrate and manufacturing method for liquid crystal panel.

BACKGROUND OF THE INVENTION

A Thin Film Transistor-Liquid Crystal Display (TFT-LCD) includes a Color Filter Substrate (CF Substrate) and a Thin Film Transistor Substrate (TFT Substrate), inner opposite sides of the substrates are provided with transparent electrodes. A layer of Liquid Crystal (LC) is provided between the two substrates. A liquid crystal display controls an alignment direction of the liquid crystal through an electric field. Changing a polarization state, and through a polarization sheet to realize a penetrating the blocking of an optical path in order to realize a display.

The color filter substrate is a key component for colorizing the liquid crystal display. In the conventional art, the manufacturing process for the color filter substrate is sequentially coating and exposing a black matrix material, a red, a green, a blue photoresist material and manufacturing a spacing column. The manufacturing steps of the above are more, and the production efficiency is lower.

Along the development of the display technology, how to reduce the process in the manufacturing process of the liquid crystal panel in order to save the manufacturing cost is a research direction of the industry.

SUMMARY OF THE INVENTION

The technology problem solved by the present invention is to provide a manufacturing method for liquid crystal panel, through simplifying the manufacturing process of the color filter substrate to reduce the process in the manufacturing process of the liquid crystal panel, save the manufacturing cost.

In order to realize the above purpose, a technology adopted by the embodiment of the present invention is:

on the one hand, the present invention provides a manufacturing method for color filter substrate, comprising: coating and exposing three layers of photoresist materials on a first substrate, and colors of the three layers of the photoresist materials are respectively a red color, a green color and a blue color; in the coating and exposure processes, a red color resist block, a green color resist block and a blue color resist block are formed; forming a light-shielding layer through mixing of two different colors of the photoresist materials in the three layers of the photoresist materials; and forming a spacing layer through stacking of two different colors of the photoresist materials in the three layers of the photoresist materials.

Furthermore, the step of coating and exposing three layers of photoresist materials on a first substrate comprises: coating a red photoresist material on the first substrate, and exposing and developing the first substrate in order to form a red color resist block, a red spacing block, and a first color resist layer located at a light-shielding region; coating a green photoresist material on the first substrate, exposing and developing the first substrate in order to form a green color resist block; and coating a blue photoresist material on the first substrate, and exposing and developing the first substrate in order to form a blue color resist block, a blue spacing block, a second color resist layer located at the light-shielding region; wherein, the red photoresist material of the first color resist layer and the blue photoresist material of the second color resist layer are mixed in the light-shielding region in order to form the light-shielding layer; the blue spacing block and the red spacing block are stacked in order to form the spacing layer.

Furthermore, the red color resist block, the green color resist block and the blue color resist block are all formed through adopting a fully light-transmitting mask for exposing.

Furthermore, the first color resist layer and the second color resist layer are formed through adopting a partly light-transmitting mask for exposing, and a height of the light-shielding layer and a height of the red color resist layer are the same.

Furthermore, the spacing layer includes a main spacing layer and an auxiliary spacing layer arranged alternately; the main spacing layer includes a red main spacing block formed by exposing the red photoresist material through a fully light-transmitting mask, the main spacing layer includes a blue main spacing block formed by exposing the blue photoresist material through a fully light-transmitting mask, and the blue main spacing block and the red main spacing block are stacked to form the main spacing layer; the auxiliary spacing layer includes a red auxiliary spacing block formed by exposing the red photoresist material through a partly light-transmitting mask, the auxiliary spacing layer includes a blue auxiliary spacing block formed by exposing the blue photoresist material through a partly light-transmitting mask, and the red auxiliary spacing block and the blue auxiliary spacing block are stacked to form the auxiliary spacing layer.

Furthermore, a height of the main spacing layer is in a range of 3.2 μm~3.7 μm.

Furthermore, a transmittance of the partly light-transmitting mask is in a range of 20%~50%.

Furthermore, the light-shielding layer is formed through a mixing of a red photoresist material and a blue photoresist material or a mixing of a red photoresist material and a green photoresist material in the coating and exposing process, and the light-shielding layer presented as a black color.

Wherein, the spacing layer includes a main spacing layer and an auxiliary spacing layer arranged alternately, the main spacing layer is formed by stacking two photoresist materials having two different colors through adopting a fully light-transmitting mask for exposing; the auxiliary spacing layer is formed by stacking two photoresist materials having two different colors through adopting a partly light-transmitting mask for exposing.

On the other hand, the present invention also provides a manufacturing method for liquid crystal panel, comprising the manufacturing method for color filter substrate described in anyone of above; dropping liquid crystals on a color filter substrate; and adhering a second substrate to the color filter substrate, and bonding an edge region of the second substrate and an edge region of the first substrate through a frame adhesive.

The color filter substrate of the liquid crystal panel provided by the present invention adopts two layers of photoresist materials to mix to form the light-shielding layer, multiple layers of photoresist materials to mix to form the spacing layer. The manufacturing process of the liquid crystal panel is less, operation is simple, obtaining a good effect and save the manufacturing cost at the same time.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail.

Figure 1:
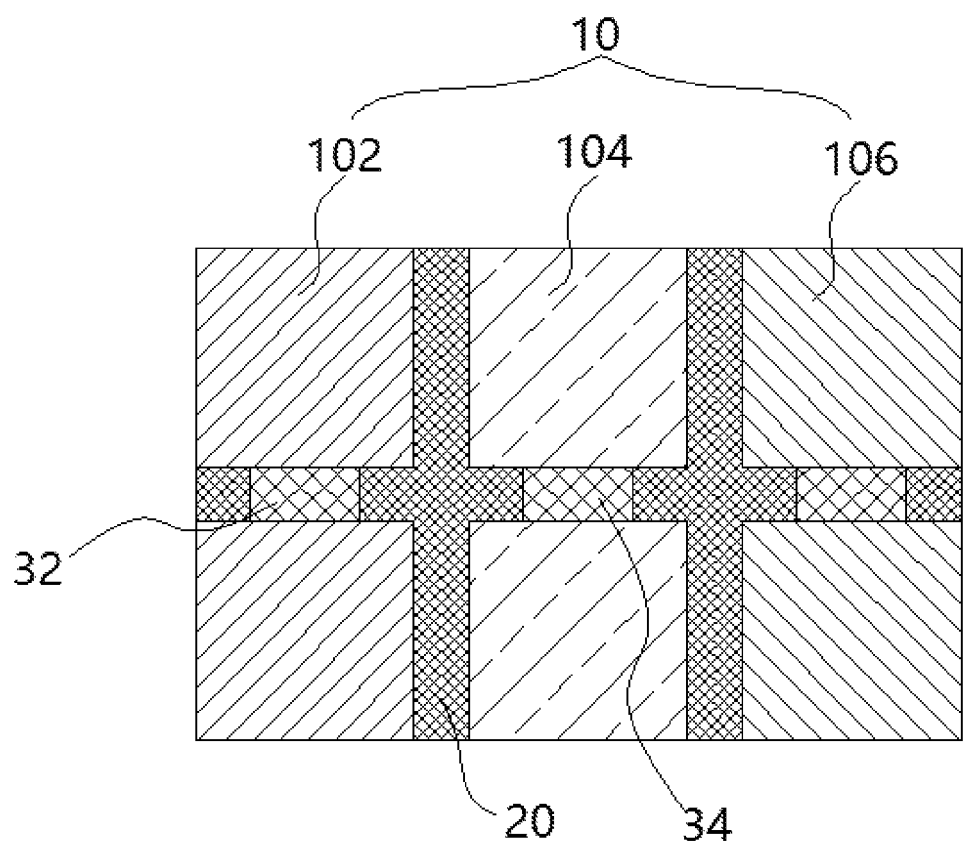
FIG. 1 is a top view of a color filter substrate of a liquid crystal panel of a first embodiment of the present invention.

FIG. 1 is a top view of a color filter substrate of a liquid crystal panel of a first embodiment of the present invention.

As shown in FIG. 1, the color filter substrate includes a single color resist layer 10, a light-shielding layer 20, a main spacing layer 32 and an auxiliary spacing layer 34. The main spacing layer 32 and the auxiliary spacing layer 34 are collectively referred to as a spacing layer. In one embodiment, the main spacing layer 32 and the auxiliary spacing layer 34 have a height difference, wherein, the single color resist layer 10 includes a red color resist block 102, a green color resist block 104, and a blue color resist block 106. The color resist blocks (that is the red color resist block 102, the green color resist block 104, and the blue color resist block 106) of the single color resist layer 10 are separated by the light-shielding layer 20. The spacing layer provides a supporting function in the liquid crystal panel.

With reference to FIG. 2 to FIG. 10, a first embodiment of the present invention provides a manufacturing method for a color filter substrate and a manufacturing method for a liquid crystal panel. The present invention respectively coats and exposes three layers of photoresist materials on the first substrate 1, the colors of the three layers of photoresist materials are respectively a red color, a green color and a blue color. In the coating and exposure processes, the red color resist block 102, the green color resist block 104 and the blue color resist block 106 are formed. At the same time, through mixing or stacking of two different colors of the photoresist materials in the three layers of photoresist materials, the light-shielding layer 20 and the spacing layer are formed.

Figure 2:
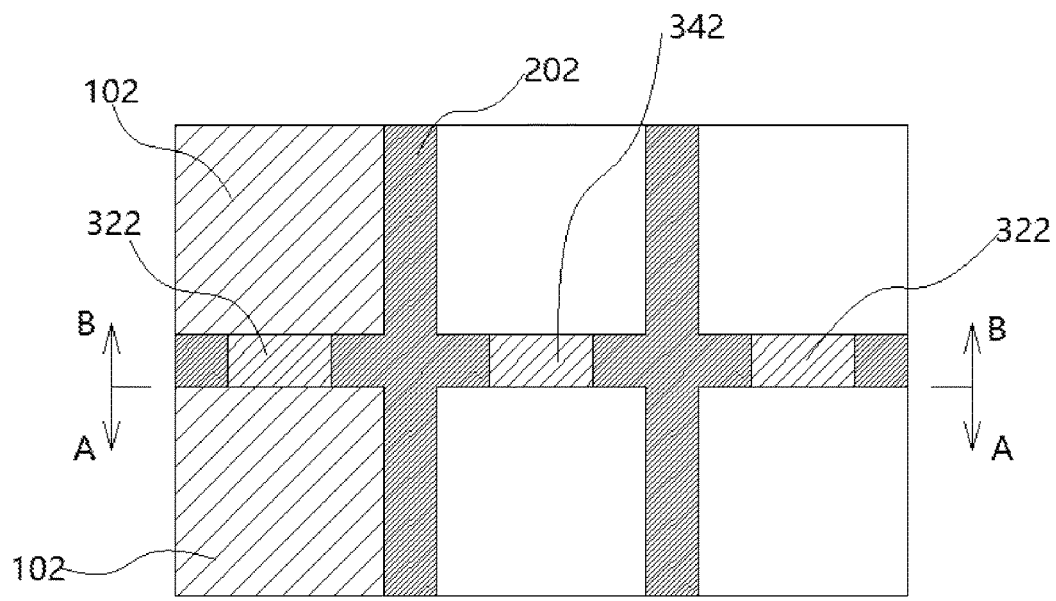
FIG. 2 is a top view of step 1 of the manufacturing method of the liquid crystal panel provided by the first embodiment of the present invention.
Figure 3:
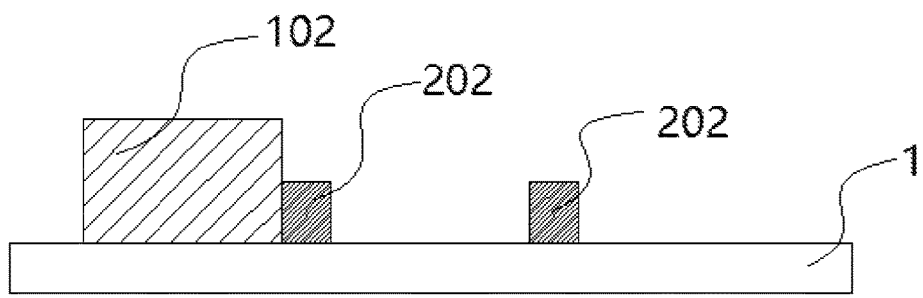
FIG. 3 is a cross-sectional view of A-A line of step 1 of the manufacturing method of the liquid crystal panel provided by the first embodiment of the present invention.
Figure 4:
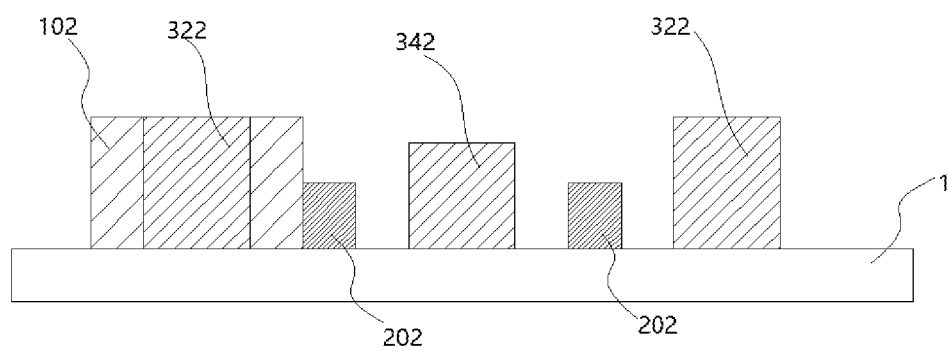
FIG. 4 is a cross-sectional view of B-B line of step 1 of the manufacturing method of the liquid crystal panel provided by the first embodiment of the present invention.

In one embodiment, the specific steps of the present invention are as following:

Step 1, with reference to FIG. 2 to FIG. 4, coating a red photoresist material on the first substrate 1, and exposing and developing the first substrate 1 coated with the red color resist material in order to form a red color resist block 102, a red main spacing block 322, a red auxiliary spacing block 342 and a first color resist layer 202 located at the light-shielding region. In one embodiment, through a fully light-transmitting mask to perform an exposure in order to form the red color resist block 102, the red main spacing block 322, and through a partly light-transmitting mask to perform an exposure in order to form the first color resist layer 202 and the red auxiliary spacing block 342. Wherein, the transmittance of the partly light-transmitting mask is in a range of 20%~50%.

The number of each of the red color resist block 102, the red main spacing block 322, the red auxiliary spacing block 342 and the first color resist layer 202 is multiple, and is arranged as a matrix. FIG. 2 shows a partial top view of the first substrate 1, and using a first row as an example for illustrating. The first row includes two first color resist layers 202 which are separated. One of the two first color resist layers 202 is connected with a side of the red color resist block 102, and two sides of the other of the two first color resist layers 202 form a bare region. The bare region is used for manufacturing a green color resist block and a blue color resist block. The red main spacing block 322, the red auxiliary spacing block 342 are arranged at a location of the first color resist layer 202.

With reference to FIG. 3, a height of the first color resist layer 202 is one half of the red color resist block 102. A surface of the first color resist layer 202 is used for forming other color resist blocks having other colors such that through a mixing of the color resist blocks having different colors, a light-shielding function is achieved. As shown in FIG. 4, a height of the red main spacing block 322 is the same as the red color resist block 102, and a height of the red auxiliary spacing block 342 is lower than the red color resist block 102.

Figure 5:
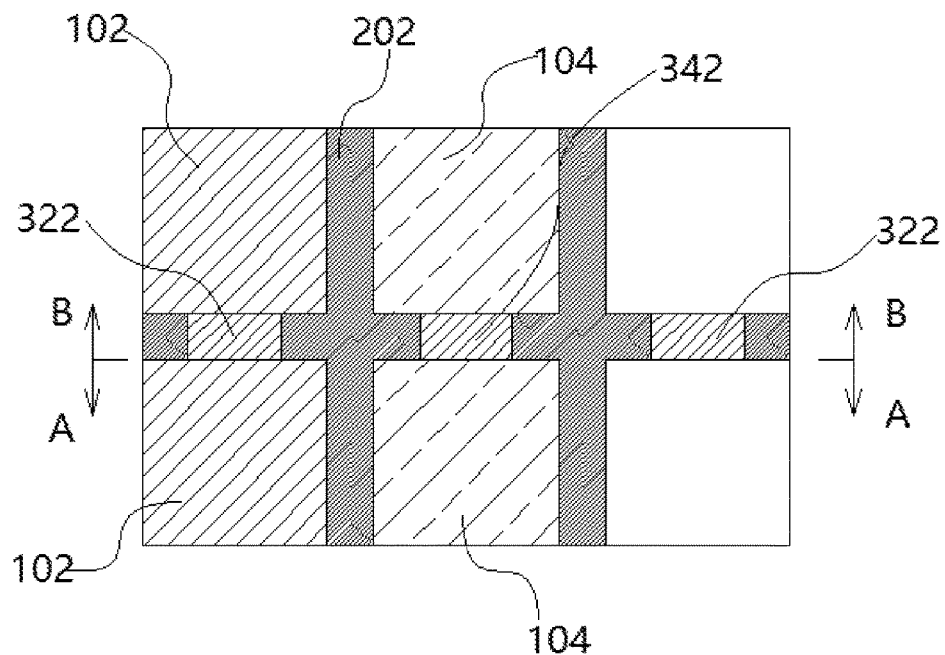
FIG. 5 is a top view of step 2 of the manufacturing method of the liquid crystal panel provided by the first embodiment of the present invention.
Figure 6:
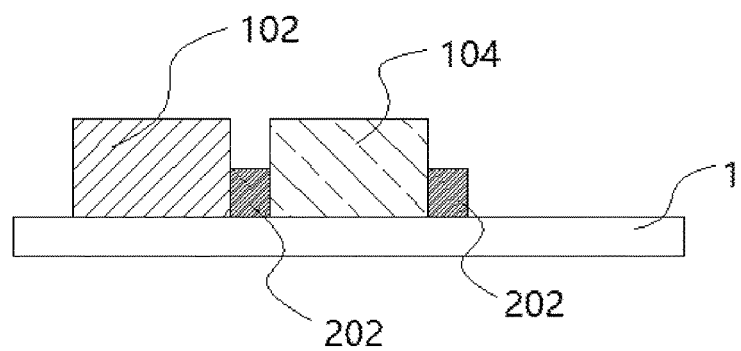
FIG. 6 is a cross-sectional view of A-A line of step 2 of the manufacturing method of the liquid crystal panel provided by the first embodiment of the present invention.
Figure 7:
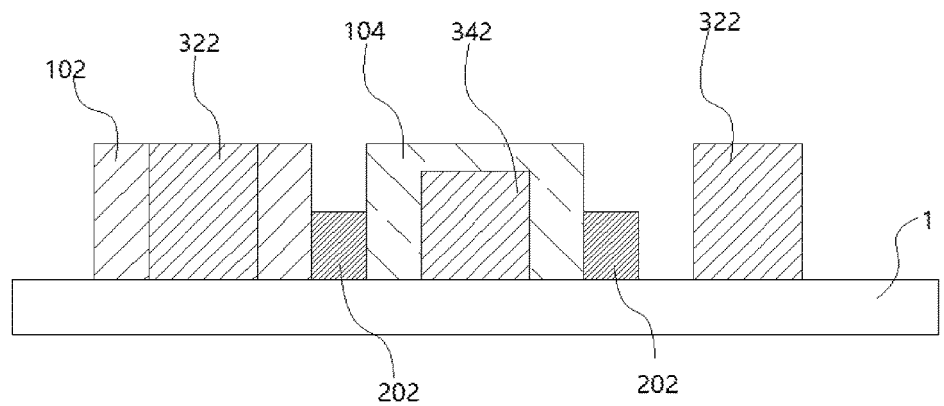
FIG. 7 is a cross-sectional view of B-B line of step 2 of the manufacturing method of the liquid crystal panel provided by the first embodiment of the present invention.

Step 2, with reference to FIG. 5 to FIG. 7, coating a green color resist material on the first substrate 1, exposing and developing the first substrate 1 coated with the green color resist material in order to form a green color resist block 104 on the first substrate 1. In one embodiment, through a fully light-transmitting mask to perform an exposure in order to form the green color resist block 104.

The number of the green color resist block 104 is multiple, and is arranged as a matrix. FIG. 5 shows a partial top view of the first substrate 1. Using a first row as an example for illustrating, the green color resist block 104 is disposed between the two first color resist layers 202.

With reference to FIG. 6, a height of the green color resist block 104 is two times of a height of the first color resist layer 202. As shown in FIG. 7, the height of the green color resist block 104 is the same as the height of the red color resist block 102 and the red main spacing block 322.

Figure 8:
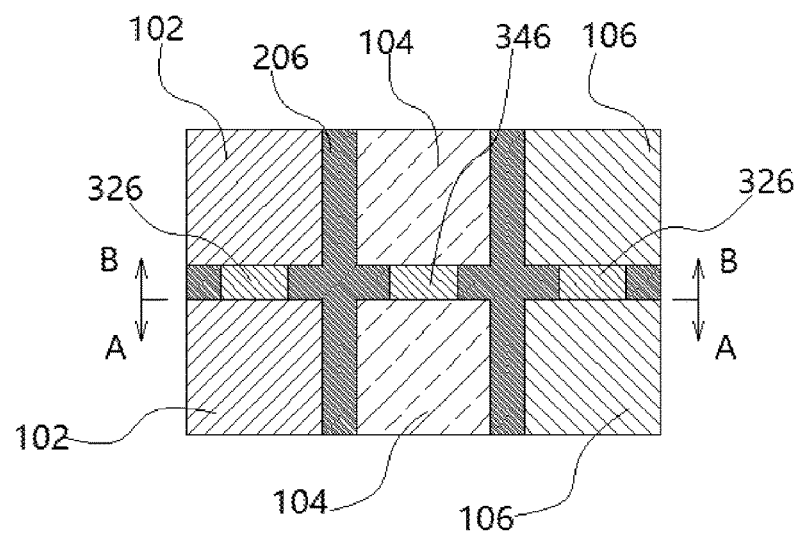
FIG. 8 is a top view of step 3 of the manufacturing method of the liquid crystal panel provided by the first embodiment of the present invention.
Figure 9:
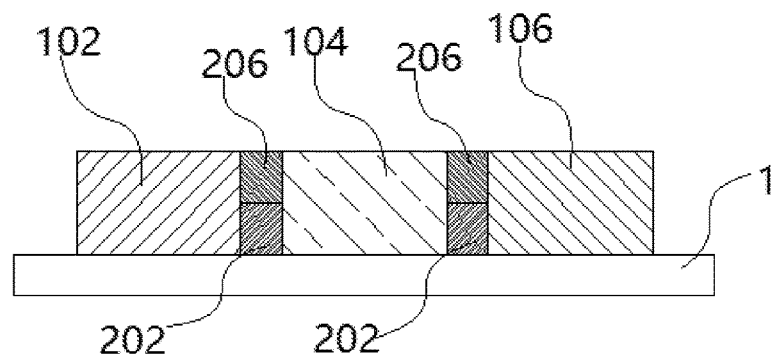
FIG. 9 is a cross-sectional view of A-A line of step 3 of the manufacturing method of the liquid crystal panel provided by the first embodiment of the present invention.
Figure 10:
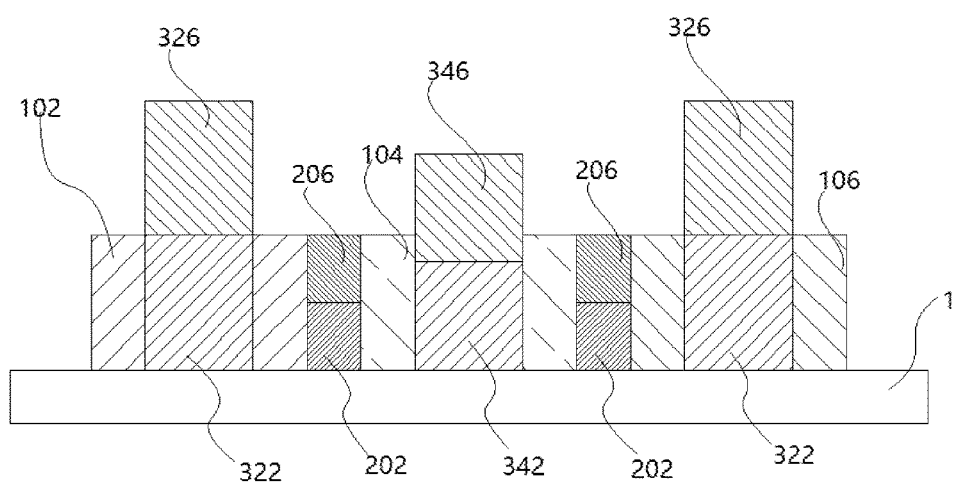
FIG. 10 is a cross-sectional view of B-B line of step 3 of the manufacturing method of the liquid crystal panel provided by the first embodiment of the present invention.

Step 3, with reference to FIG. 8 to FIG. 10, coating a blue photoresist material on the first substrate 1, and exposing and developing the first substrate 1 coated with the red photoresist material and the green photoresist material in order to form a blue color resist block 106, a blue main spacing block 326, a second color resist layer 206 located at the light-shielding region and a blue auxiliary spacing block 346 located at the light-shielding region on the first substrate 1. In one embodiment, through a fully light-transmitting mask to perform an exposure in order to form the blue color resist block 106, the blue main spacing block 326, and simultaneously, through a partly light-transmitting mask to perform an exposure in order to form the second color resist layer 206 and the blue auxiliary spacing block 346. Wherein, the transmittance of the partly light-transmitting mask is in a range of 20%~50%.

The number of each of the blue color resist block 106, the blue main spacing block 326, the blue auxiliary block 346 and the second color resist layers 206 are multiple, and is arranged as a matrix. FIG. 8 shows a partial top view of the first substrate 1. Using a first row as an example for illustrating, the blue color resist block 106 is disposed at a right side of the second color resist layer 206.

With reference to FIG. 9, a height of the second color resist layer 206 is one half of the height of the blue color resist block 106, and the second color resist layer 206 is formed on a surface of the first color resist layer 202. The second color resist layer 206 and the first color resist layer 202 are mixed to form a light-shielding layer 20 (with reference to FIG. 11). With further reference to FIG. 10, the height of the blue main spacing block 326 is the same as the height of the blue color resist block 106, and the blue main spacing block 326 is formed on a surface of the red main spacing block 322, the blue main spacing block 326 and the red main spacing block 322 are stacked to form a main spacing layer 32 (with reference to FIG. 11). A height of the main spacing layer is in a range of 3.2 μm~3.7 μm. The height of the blue auxiliary block 346 is the same as the height of the red auxiliary block 342. The blue auxiliary spacing block 346 is formed on a surface of the red auxiliary spacing block 342. The blue auxiliary spacing block 346 and the red auxiliary block 342 are stacked to form an auxiliary spacing layer 34 (with reference to FIG. 11). The height of the light-shielding layer 20 is the same as the height of the single color resist layer 10. The height of the auxiliary spacer 34 is lower than the main spacing layer 32 in order to form a height difference.

The second color resist layer 206 and the first color resist layer 202 located at the light-shielding region are mixed to form the light-shielding layer 20 presented as a black color. In other embodiment, the present invention can also form the black light-shielding layer through a mixing of the first color resist layer 202 and the green photoresist material exposing by a partly light-transmitting mask at the light-shielding region.

In the present invention, through sequentially coating and exposing three layers of the photoresist materials on the first substrate 1, in the coating and exposing process, through the mixing of the color resist layers to form the light-shielding layer 20, through the stacking of the color resist layers to form the main spacing layer 32 and the auxiliary spacing layer 34. Accordingly, through coating and exposing the first substrate 1 three times, a color filter substrate is formed so as to save the processes and decrease the manufacturing cost.

Step 4, dropping liquid crystals 3 on the color filter substrate, and adhering a second substrate 2 to the color filter substrate. At an edge region of the second substrate 2 and an edge region of the first substrate 1, using a frame adhesive 4 for adhering. The second substrate 2 is an array substrate.

The manufacturing processes of the liquid crystal panel provided by the first embodiment of the present invention is less, adopting the first color resist layer 202 and the second color resist layer located at the light-shielding region to mix to form the light-shielding layer 20. The red main spacing block 322 and the blue main spacing block 326 are stacked to form the main spacing layer 32. The red auxiliary spacing block 342 and the blue auxiliary spacing block 346 are stacked to form the auxiliary spacing layer 34. Accordingly, the manufacturing process is simplified, and the material cost is saved.

Figure 11:
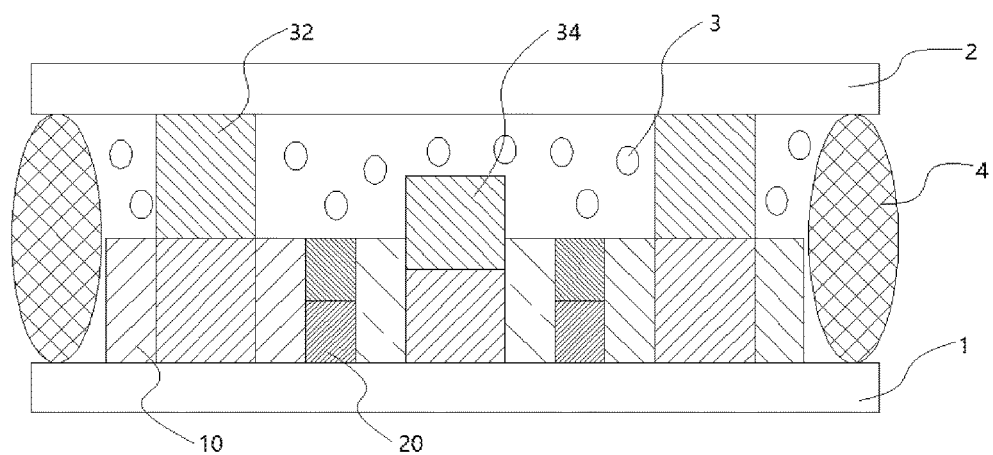
FIG. 11 is a cross-sectional view of a liquid crystal panel provided by the first embodiment of the present invention.

FIG. 11 is a cross-sectional view of a liquid crystal panel provided by a first embodiment of the present invention. As shown in the figure, the liquid crystal panel includes a first substrate 1 and a second substrate 2 which are stacked, and liquid crystals 3 disposed between the both. Between the first substrate 1 and the second substrate 2, a single color resist layer 10, a light-shielding layer 20, a main spacing layer 32 and an auxiliary spacing layer 34. At an edge region of the second substrate 2 and an edge region of the first substrate 1, using a frame adhesive 4 for adhering. The second substrate 2 is an array substrate. The liquid crystal panel can obtain a good effect and save the manufacturing cost at the same time.

Figure 12:
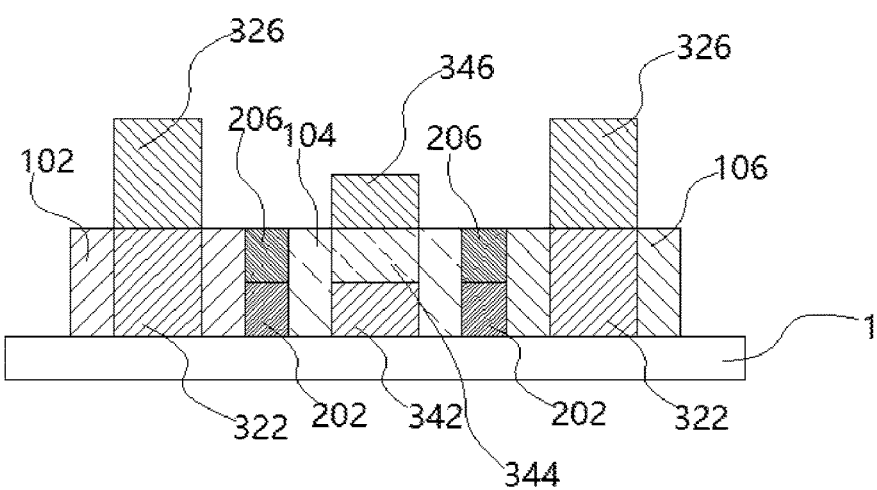
FIG. 12 is a cross-sectional view of a color filter substrate of the liquid crystal panel provided by the second embodiment of the present invention.

FIG. 12 is a cross-sectional view of a liquid crystal panel provided by a second embodiment of the present invention. As shown in the figure, the difference is, the auxiliary spacing layer 34 is formed by stacking the red auxiliary spacing block 342, the green auxiliary spacing block 344 and the blue auxiliary spacing block 346. That is, the auxiliary spacing layer 34 can be formed by stacking at least two photoresist materials having two different colors. Of course, the main spacing layer 32 can have the similar design. The red auxiliary block 342 the green auxiliary spacing block 344 and the blue auxiliary spacing block 346 are formed through using a partly light-transmitting mask for exposing the single photoresist material such that the manufacturing process of the liquid crystal panel is less, and reducing the material cost of the liquid crystal panel.

The above embodiment does not constitute a limitation of the scope of protection of the present technology solution. Any modifications, equivalent replacements and improvements based on the spirit and principles of the above embodiments should also be included in the protection scope of the present technology solution.

What is claimed is:

1. A manufacturing method for color filter substrate, comprising:
   coating and exposing three layers of photoresist materials on a first substrate, and colors of the three layers of the photoresist materials are respectively a red color, a green color and a blue color;
   in the coating and exposure processes, a red color resist block, a green color resist block and a blue color resist block are formed;
   forming a light-shielding layer through mixing of two different colors of the photoresist materials in the three layers of the photoresist materials; and
   forming a spacing layer through stacking of two different colors of the photoresist materials in the three layers of the photoresist materials.

2. The manufacturing method for color filter substrate according to claim 1, wherein, the step of coating and exposing three layers of photoresist materials on a first substrate comprises:
   coating a red photoresist material on the first substrate, and exposing and developing the first substrate in order to form a red color resist block, a red spacing block, and a first color resist layer located at a light-shielding region;
   coating a green photoresist material on the first substrate, exposing and developing the first substrate in order to form a green color resist block; and
   coating a blue photoresist material on the first substrate, and exposing and developing the first substrate in order to form a blue color resist block, a blue spacing block, a second color resist layer located at the light-shielding region;
   wherein, the red photoresist material of the first color resist layer and the blue photoresist material of the second color resist layer are mixed in the light-shielding region in order to form the light-shielding layer; the blue spacing block and the red spacing block are stacked in order to form the spacing layer.

3. The manufacturing method for color filter substrate according to claim 2, wherein, the red color resist block, the green color resist block and the blue color resist block are all formed through adopting a fully light-transmitting mask for exposing.

4. The manufacturing method for color filter substrate according to claim 3, wherein, the first color resist layer and the second color resist layer are formed through adopting a partly light-transmitting mask for exposing, and a height of the light-shielding layer and a height of the red color resist layer are the same.

5. The manufacturing method for color filter substrate according to claim 2, wherein, the spacing layer includes a main spacing layer and an auxiliary spacing layer arranged alternately; the main spacing layer includes a red main spacing block formed by exposing the red photoresist material through a fully light-transmitting mask, the main spacing layer includes a blue main spacing block formed by exposing the blue photoresist material through a fully light-transmitting mask, and the blue main spacing block and the red main spacing block are stacked to form the main spacing layer; the auxiliary spacing layer includes a red auxiliary spacing block formed by exposing the red photoresist material through a partly light-transmitting mask, the auxiliary spacing layer includes a blue auxiliary spacing block formed by exposing the blue photoresist material through a partly light-transmitting mask, and the red auxiliary spacing block and the blue auxiliary spacing block are stacked to form the auxiliary spacing layer.

6. The manufacturing method for color filter substrate according to claim 5, wherein, a height of the main spacing layer is in a range of 3.2 μm~3.7 μm.

7. The manufacturing method for color filter substrate according to claim 5, wherein, a transmittance of the partly light-transmitting mask is in a range of 20%~50%.

8. The manufacturing method for color filter substrate according to claim 1, wherein, the light-shielding layer is formed through a mixing of a red photoresist material and a blue photoresist material or a mixing of a red photoresist material and a green photoresist material in the coating and exposing process, and the light-shielding layer presented as a black color.

9. The manufacturing method for color filter substrate according to claim 1, wherein, the spacing layer includes a main spacing layer and an auxiliary spacing layer arranged alternately, the main spacing layer is formed by stacking two photoresist materials having two different colors through adopting a fully light-transmitting mask for exposing; the auxiliary spacing layer is formed by stacking two photoresist materials having two different colors through adopting a partly light-transmitting mask for exposing.

10. A manufacturing method for liquid crystal panel, comprising:
    a manufacturing method for color filter substrate, including coating and exposing three layers of photoresist materials on a first substrate, and colors of the three layers of the photoresist materials are respectively a red color, a green color and a blue color; in the coating and exposure processes, a red color resist block, a green color resist block and a blue color resist block are formed; forming a light-shielding layer through mixing of two different colors of the photoresist materials in the three layers of the photoresist materials; and forming a spacing layer through stacking of two different colors of the photoresist materials in the three layers of the photoresist materials;
    dropping liquid crystals on a color filter substrate; and
    adhering a second substrate to the color filter substrate, and bonding an edge region of the second substrate and an edge region of the first substrate through a frame adhesive.

11. The manufacturing method for liquid crystal panel according to claim 10, wherein, the step of coating and exposing three layers of photoresist materials on a first substrate comprises:
    coating a red photoresist material on the first substrate, and exposing and developing the first substrate in order to form a red color resist block, a red spacing block, and a first color resist layer located at a light-shielding region;
    coating a green photoresist material on the first substrate, exposing and developing the first substrate in order to form a green color resist block; and
    coating a blue photoresist material on the first substrate, and exposing and developing the first substrate in order to form a blue color resist block, a blue spacing block, a second color resist layer located at the light-shielding region;
    wherein, the red photoresist material of the first color resist layer and the blue photoresist material of the second color resist layer are mixed in the light-shielding region in order to form the light-shielding layer; the blue spacing block and the red spacing block are stacked in order to form the spacing layer.

12. The manufacturing method for liquid crystal panel according to claim 11, wherein, the red color resist block, the green color resist block and the blue color resist block are all formed through adopting a fully light-transmitting mask for exposing.

13. The manufacturing method for liquid crystal panel according to claim 12, wherein, the first color resist layer and the second color resist layer are formed through adopting a partly light-transmitting mask for exposing, and a height of the light-shielding layer and a height of the red color resist layer are the same.

14. The manufacturing method for liquid crystal panel according to claim 11, wherein, the spacing layer includes a main spacing layer and an auxiliary spacing layer arranged alternately; the main spacing layer includes a red main spacing block formed by exposing the red photoresist material through a fully light-transmitting mask, the main spacing layer includes a blue main spacing block formed by exposing the blue photoresist material through a fully light-transmitting mask, and the blue main spacing block and the red main spacing block are stacked to form the main spacing layer; the auxiliary spacing layer includes a red auxiliary spacing block formed by exposing the red photoresist material through a partly light-transmitting mask, the auxiliary spacing layer includes a blue auxiliary spacing block formed by exposing the blue photoresist material through a partly light-transmitting mask, and the red auxiliary spacing block and the blue auxiliary spacing block are stacked to form the auxiliary spacing layer.

15. The manufacturing method for liquid crystal panel according to claim 14, wherein, a height of the main spacing layer is in a range of 3.2 μm~3.7 μm.

16. The manufacturing method for liquid crystal panel according to claim 14, wherein, a transmittance of the partly light-transmitting mask is in a range of 20%~50%.

17. The manufacturing method for liquid crystal panel according to claim 10, wherein, the light-shielding layer is formed through a mixing of a red photoresist material and a blue photoresist material or a mixing of a red photoresist material and a green photoresist material in the coating and exposing process, and the light-shielding layer presented as a black color.

18. The manufacturing method for liquid crystal panel according to claim 10, wherein, the spacing layer includes a main spacing layer and an auxiliary spacing layer arranged alternately, the main spacing layer is formed by stacking two photoresist materials having two different colors through adopting a fully light-transmitting mask for exposing; the auxiliary spacing layer is formed by stacking two photoresist materials having two different colors through adopting a partly light-transmitting mask for exposing.

* * * * *